US009209034B2

(12) United States Patent
Kitamura et al.

(10) Patent No.: US 9,209,034 B2
(45) Date of Patent: Dec. 8, 2015

(54) PLASMA ETCHING METHOD AND PLASMA ETCHING APPARATUS

(71) Applicant: TOKYO ELECTRON LIMITED, Tokyo (JP)

(72) Inventors: Akinori Kitamura, Miyagi (JP); Kenta Yasuda, Miyagi (JP); Shunsuke Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/373,055

(22) PCT Filed: Jan. 31, 2013

(86) PCT No.: PCT/JP2013/000524
§ 371 (c)(1),
(2) Date: Jul. 18, 2014

(87) PCT Pub. No.: WO2013/114882
PCT Pub. Date: Aug. 8, 2013

(65) Prior Publication Data
US 2015/0024603 A1 Jan. 22, 2015

Related U.S. Application Data

(60) Provisional application No. 61/596,277, filed on Feb. 8, 2012.

(30) Foreign Application Priority Data

Feb. 1, 2012 (JP) .................................. 2012-019744

(51) Int. Cl.
*H01L 21/302* (2006.01)
*H01L 21/461* (2006.01)
*H01L 21/3065* (2006.01)
*H01L 21/3213* (2006.01)
*H01J 37/32* (2006.01)

(52) U.S. Cl.
CPC ...... *H01L 21/30655* (2013.01); *H01J 37/32091* (2013.01); *H01J 37/32165* (2013.01); *H01L 21/32136* (2013.01); *H01L 21/32139* (2013.01)

(58) Field of Classification Search
CPC .................. H01L 21/30655; H01L 21/32136; H01L 21/32139; H01J 37/32091; H01J 37/32165
USPC ......................................................... 438/711
See application file for complete search history.

(56) References Cited

U.S. PATENT DOCUMENTS 7,183,219 B1    2/2007  Hama et al.
2013/0344702 A1*  12/2013  Nishizuka ..................... 438/724

FOREIGN PATENT DOCUMENTS

JP      2000-173986 A    6/2000
JP      2009-283893 A    12/2009

OTHER PUBLICATIONS

International Search Report mailed Apr. 9, 2013 in PCT/JP2013/000524.

*Primary Examiner* — Roberts Culbert
(74) *Attorney, Agent, or Firm* — Rothwell, Figg, Ernst & Manbeck, P.C.

(57) ABSTRACT

In a plasma etching method for etching a metal layer of a substrate to be processed through a hard mask by using a plasma etching apparatus, a first step in which a first etching gas comprising a mixed gas of $O_2$, $CF_4$ and HBr is used as an etching gas, and a second step in which a second etching gas comprising a mixed gas of $O_2$ and $CF_4$ is used as an etching gas, are continuously and alternately repeated a plurality of times. At this time, a first high-frequency power of a first frequency and a second high-frequency power of a second frequency, which is lower than the first frequency, are applied to a lower electrode, and the first high-frequency power is applied in a pulse form.

8 Claims, 4 Drawing Sheets

PLASMA ETCHING METHOD AND PLASMA ETCHING APPARATUS

CROSS REFERENCE TO RELATED APPLICATION

This application is a 35 U.S.C. 371 National Phase Entry Application from PCT/JP2013/000524, filed Jan. 31, 2013, which claims the benefit of and claims priority to U.S. Provisional Application No. 61/596,277, filed Feb. 8, 2012 and Japanese Patent Application No. 2012-019744, filed Feb. 1, 2012, the disclosures of which are incorporated herein in their entirety by reference.

FIELD OF THE INVENTION

The present invention relates to a plasma etching method and a plasma etching apparatus.

BACKGROUND OF THE INVENTION

Conventionally, in a semiconductor device manufacturing process, plasma etching for etching a metal film such as a tungsten film or the like formed on a substrate (semiconductor wafer) to be processed is carried out by generating a plasma from an etching gas and acting the generated plasma on the substrate (see, e.g., Patent Document 1). As for an apparatus for performing such plasma etching, a so-called capacitively coupled plasma etching apparatus is known. In the capacitively coupled plasma etching apparatus, an upper electrode and a lower electrode are provided in a processing chamber opposite to each other, and a plasma is generated by applying a high frequency power between the electrodes. Further, there is known a technique for preventing charging damage that occurs when a contact hole is formed in an insulating film by applying a high frequency power in a pulse form (see, e.g., Patent Document 2).

Patent Document 1: Japanese Patent Application Publication No. 2000-173986

Patent Document 2: Japanese Patent Application Publication No. 2009-283893

Meanwhile, the metal film, e.g., a tungsten film or the like, may be etched through a hard mask made of, e.g., a silicon oxide film or the like, by the above plasma etching. In such plasma etching, an etching gas containing a mixed gas of $O_2$ gas and $CF_4$ gas is used.

However, in the case of etching the tungsten film through the hard mask made of a silicon oxide film or the like as described above, it is difficult to obtain a desired etching selectivity of the hard mask to the tungsten film (etching rate of the tungsten film/etching rate of the hard mask) and the etching selectivity becomes about 1. For example, when there is a difference in pattern density, i.e., when the pattern has a dense portion and a sparse portion, it is difficult to ensure good etching shapes (bowing shape, tapered shape and the like) both in the dense portion and in the sparse portion.

SUMMARY OF THE INVENTION

In view of the above, the present invention provides a plasma etching method and a plasma etching apparatus which can improve an etching selectivity of a hard mask to a metal film and ensure a good etching shape even when there is a difference in pattern density.

In accordance with an aspect of the present invention, there is provided a plasma etching method for etching a metal layer of a substrate to be processed through a hard mask by using a plasma etching apparatus which includes a processing chamber configured to accommodate the substrate; a lower electrode, disposed in the processing chamber, for mounting the substrate thereon; an upper electrode disposed opposite to the lower electrode in the processing chamber; an etching gas supply unit configured to supply a predetermined etching gas into the processing chamber; and a gas exhaust unit configured to exhaust the processing chamber, the plasma etching method including: continuously and alternately repeating a plurality of times a first step in which a first etching gas containing a mixed gas of $O_2$, $CF_4$ and HBr is used as the etching gas and a second step in which a second etching gas containing a mixed gas of $O_2$ and $CF_4$ is used as the etching gas while applying a first high frequency power of a first frequency and a second high frequency power of a second frequency lower than the first frequency to the lower electrode, wherein the first high frequency power is applied in a pulse form.

In accordance with another aspect of the present invention, there is provided a plasma etching apparatus including: a processing chamber configured to accommodate a substrate to be processed; a lower electrode, disposed in the processing chamber, for mounting the substrate thereon; an upper electrode disposed opposite to the lower electrode in the processing chamber; an etching gas supply unit configured to supply a predetermined etching gas into the processing chamber; a gas exhaust unit configured to exhaust the processing chamber; a first high frequency power supply unit configured to apply a first high frequency power of a first frequency to the lower electrode; a second high frequency power supply unit configured to apply a second high frequency power of a second high frequency lower than the first high frequency to the lower electrode; and a control unit configured to control the first high frequency power to be applied to the lower electrode in a pulse form while continuously and alternately repeating a plurality of times a first step in which a first etching gas containing a mixed gas of $O_2$, $CF_4$ and HBr is used as the etching gas and a second step in which a second etching gas containing a mixed gas of $O_2$ and $CF_4$ is used as the etching gas, wherein the metal layer of the substrate is etched through a hard mask.

EFFECT OF THE INVENTION

In accordance with the present invention, it is possible to provide a plasma etching method and a plasma etching apparatus which can improve an etching selectivity of a hard mask to a metal film and ensure a good etching shape even when there is a difference in a pattern density.

DETAILED DESCRIPTION OF THE EMBODIMENTS

Figure 1:
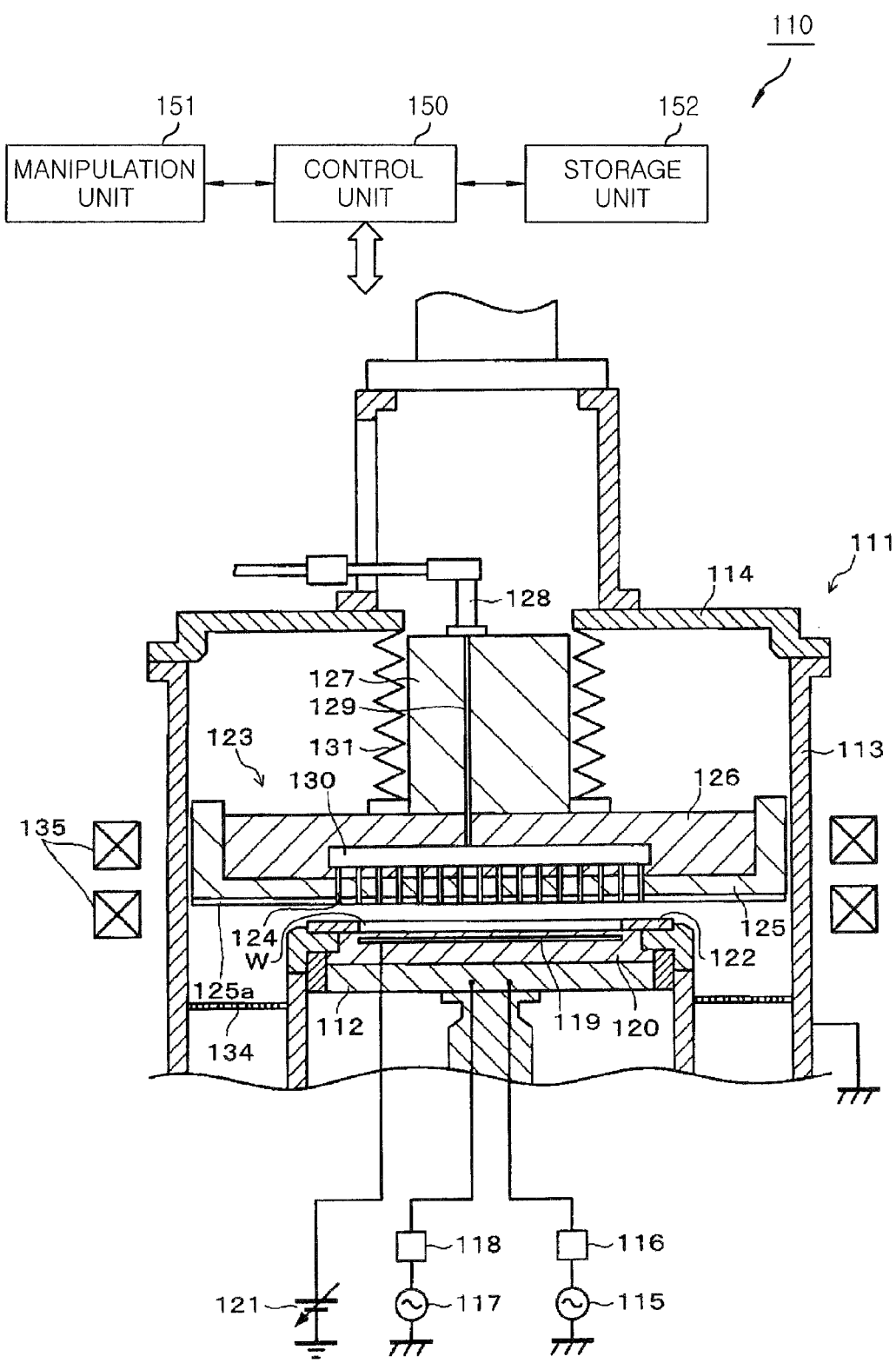
FIG. 1 schematically shows a configuration of a plasma etching apparatus in accordance with an embodiment of the present invention.

Hereinafter, embodiments of the present invention will be described with reference to the accompanying drawings. FIG.

1 schematically shows a cross sectional structure of a plasma etching apparatus in accordance with an embodiment of the present invention. A plasma etching apparatus 110 shown in FIG. 1 includes an airtight cylindrical processing chamber 111 (cylindrical vessel) for accommodating, e.g., a wafer W having a diameter of 300 mm. A circular plate-shaped mounting table 112 for mounting thereon a semiconductor wafer W is provided at a lower portion of the processing chamber 111. The processing chamber 111 has a circular tube-shaped sidewall 113, and a circular plate-shaped cover 114 for covering an upper end portion of the sidewall 113.

An annular baffle plate 134 having a plurality of gas exhaust holes is provided around the mounting table 112 in the processing chamber 111. Meanwhile, a gas exhaust unit (not shown) such as a TMP (Turbo Molecular Pump), a DP (Dry Pump) or the like is connected to a bottom portion of the processing chamber 111. A pressure in the processing chamber 111 can be maintained in a predetermined depressurized atmosphere by exhausting the processing chamber 111 through the baffle plate 134.

A first high frequency power supply 115 is connected to the mounting table 112 via a first matching unit 116. A second high frequency power supply 117 is connected to the mounting table 112 via a second matching unit 118. The first high frequency power supply 115 applies to the mounting table 112 a high frequency power for plasma generation having a relatively high frequency, e.g., higher than or equal to 80 MHz and lower than or equal to 150 MHz (100 MHz in the present embodiment). Further, the second high frequency power supply 117 applies to the mounting table 112 a bias power having a frequency lower than that of the high frequency power from the first high frequency power supply 115. In the present embodiment, the frequency of the high frequency power from the second high frequency power supply 117 is set to 13.56 MHz.

An electrostatic chuck 120 having therein an electrode plate 119 is disposed on top of the mounting table 112. The electrostatic chuck 120 is a circular plate-shaped ceramic member. A DC power supply 121 is connected to the electrode plate 119. When a positive DC voltage is applied to the electrode plate 119, a negative potential is generated on a surface (backside) of the semiconductor wafer W which faces the electrostatic chuck 120. Accordingly, an electric field is generated between the electrode plate 119 and the backside of the wafer W, and the semiconductor wafer W is electrostatically held on the electrostatic chuck 120 by Coulomb force caused by the electric field.

A focus ring 122 is mounted on the mounting table 112 so as to surround the semiconductor wafer W attracted and held thereon. The focus ring 122 is made of, e.g., quartz or the like.

A shower head 123 (movable electrode) is provided, at an upper portion of the processing chamber 111, opposite to the mounting table 112. The shower head 123 includes: a circular plate-shaped conductive upper electrode plate 125 having a plurality of gas holes 124; a cooling plate 126 which detachably holds the upper electrode plate 125; a shaft 127 for supporting the cooling plate 126; and a processing gas inlet port 128 disposed at an upper end of the shaft 127. The shower head 123 is grounded via the cover 114 and the sidewall 113 and serves as a grounding electrode against a power for plasma generation which is applied into the processing chamber 111. Further, a quartz member 125a covers a surface of the upper electrode plate 125 which faces the mounting table 112.

A gas channel 129 is formed through the shaft 127 in a vertical direction. The cooling plate 126 has therein a buffer space 130. The gas channel 129 connects the processing gas inlet port 128 and the buffer space 130. Each of the gas holes 124 communicates with the buffer space 130 and the inside of the processing chamber 111. In the shower head 123, the gas holes 124, the processing gas inlet port 128, the gas channel 129 and the buffer space 130 form a processing gas introducing system. The processing gas introducing system introduces a processing gas (etching gas) supplied to the processing gas inlet port 128 into a processing space between the shower head 123 and the mounting table 112 in the processing chamber 111.

In the shower head 123, an outer diameter of the upper electrode plate 125 is set to be slightly smaller than an inner diameter of the processing chamber 111, so that the shower head 123 is not in contact with the sidewall 113. In other words, the shower head 123 is disposed in the processing chamber 111 with a gap therebetween. The shaft 127 penetrates through the cover 114, and an upper portion of the shaft 127 is connected to a lift mechanism (not shown) provided above the plasma etching apparatus 110. The lift mechanism moves the shaft 127 in a vertical direction in the drawing. At this time, the shower head 123 vertically moves like a piston in the processing chamber 111 along a central axis thereof. Accordingly, it is possible to adjust a gap that is the height of the processing space between the shower head 123 and the mounting table 112.

A bellows 131 is an expansible/contractible pressure partition wall made of, e.g., stainless steel. The bellows 131 has one end connected to the cover 114 and the other end connected to the shower head 123. Further, the bellows 131 has a function of sealing the inside of the processing chamber 111 against the outside of the processing chamber 111. In addition, a plurality of segment magnets 135 formed of permanent magnets is arranged outside the processing chamber 111 so as to surround the processing chamber 111 in a ring shape. A magnetic field is generated in the processing chamber 111 by the segment magnets 135.

In the plasma etching apparatus 110, the etching gas supplied to the processing gas inlet port 128 is introduced into the processing space through the processing gas introducing system, and the introduced etching gas is excited into a plasma by the action of the high frequency power applied to the processing space and the magnetic field generated by the magnets 135. Positive ions in the plasma are attracted toward the semiconductor wafer W mounted on the mounting table 112 by a negative bias potential generated by the bias power applied to the mounting table 112. As a result, the semiconductor wafer W is etched.

The overall operation of the plasma etching apparatus 110 configured as described above is controlled by a control unit 150 having a CPU or the like. The control unit 150 includes a manipulation unit 151 and a storage unit 152.

The manipulation unit 151 has a keyboard through which a process manager inputs commands to manage the plasma etching apparatus 110, a display for visually displaying an operation state of the plasma etching apparatus 110, and the like.

The storage unit 152 stores therein control programs (software) for implementing various processes performed in the plasma etching apparatus 110 under the control of the control unit 150, and recipes including processing condition data and the like. When necessary, a desired recipe is retrieved from the storage unit 152 and executed by the control unit 152 in response to an instruction from the manipulation unit 151 or the like. Accordingly, a desired process is performed in the plasma etching apparatus 110 under the control of the control unit 150. The control programs and the recipes such as the processing condition data and the like may be stored in a computer readable storage medium (e.g., a hard disk, a CD, a flexible disk, a semiconductor memory or the like) or may be transmitted on-line from another device through, e.g., a dedicated line, whenever necessary.

Next, a sequence for performing plasma etching on the tungsten layer or the like formed on the semiconductor wafer W by the plasma etching apparatus 110 configured as described above will be described. First, a gate valve (not shown) installed at the processing chamber 111 is opened, and the semiconductor wafer W is loaded into the processing chamber 111 via a load-lock chamber (not shown) by a transfer robot (not shown) or the like and then mounted on the mounting table 112. Next, the transfer robot is retreated from the processing chamber 111, and the gate valve is closed. Then, the processing chamber 111 is exhausted by the gas exhaust unit (not shown).

After a pressure in the processing chamber 111 reaches a predetermined vacuum level, a predetermined etching gas is introduced through the processing gas supply system into the processing chamber 111, and the pressure in the processing chamber 111 is maintained at a predetermined level, e.g., 0.665 Pa (5 mTorr) or less. In this state, high frequency powers are supplied from the first and the second high frequency power supply 115 and 117 to the mounting table 112. At this time, a predetermined DC voltage is applied from the DC power supply 121 to the electrode plate 119 of the electrostatic chuck 120, and the semiconductor wafer W is attracted and held on the electrostatic chuck 6 by the Coulomb force or the like.

In that case, by the application of the high frequency powers to the mounting table 112 serving as the lower electrode, an electric field is generated between the shower head 123 serving as the upper electrode and the mounting table 112 serving as the lower electrode, as described above. Hence, electric discharge occurs in the processing space where the semiconductor wafer W is provided. Accordingly, the etching gas is turned into a plasma, and predetermined plasma etching is performed on the semiconductor wafer W.

Upon completion of the predetermined plasma etching, the supply of the high frequency powers and the supply of the etching gas are stopped, and the semiconductor wafer W is unloaded from the processing chamber 111 in the reverse sequence to that described above.

Figure 2A:
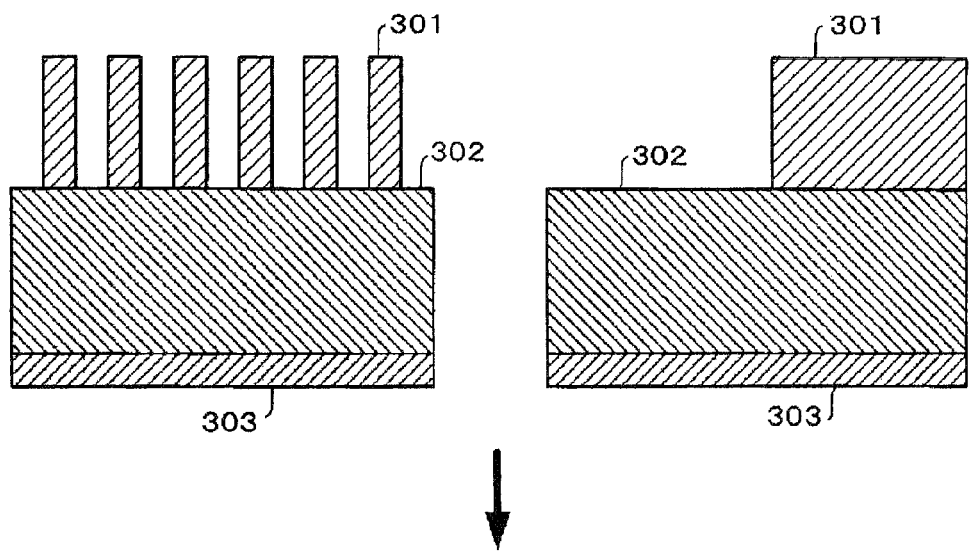
FIGS. 2A and 2B schematically show cross sectional structures of a semiconductor wafer in accordance with the embodiment of the present invention.
Figure 2B:
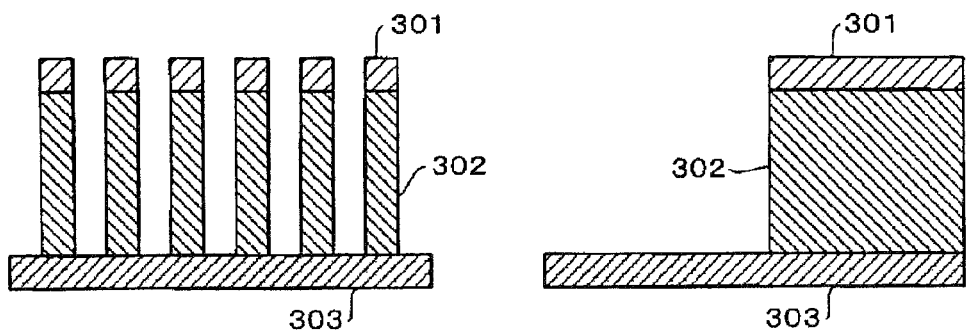

FIGS. 2A and 2B are schematic enlarged views showing cross sectional structures of the semiconductor wafer in the present embodiment. As shown in FIG. 2A, a silicon oxide film 301 serving as a hard mask patterned in a predetermined shape is formed as an uppermost layer of the semiconductor wafer, and a tungsten layer 302 that is a metal film is formed below the silicon oxide film 301. A base film (TiN film) 303 made of another material is formed below the tungsten layer 302. The left sides of FIGS. 2A and 2B show a dense portion of the pattern, and the right sides of FIGS. 2A and 2B show a sparse portion of the pattern.

Then, the tungsten layer 302 is plasma-etched in a predetermined pattern while using the silicon oxide film 301 as a mask. As a result, the state shown in FIG. 2A is changed to the state shown in FIG. 2B. At this time, the silicon oxide film 301 is also etched by the plasma etching, so that the thickness thereof is reduced.

TEST EXAMPLE 1

In a test example 1, the plasma etching apparatus 110 shown in FIG. 1 was used to plasma-etch a tungsten layer formed on an Si substrate (semiconductor wafer W) having a diameter of 300 mm through a hard mask (formed of a silicon oxide film) patterned thereon in a predetermined shape. Under the following plasma etching conditions, a first and a second step were repeated four times continuously. In the second step of the fourth (final) cycle, the etching time was increased to 26 sec.

(First Step)
Pressure in the processing chamber: 0.655 Pa (5 mTorr) or less
Processing gas: $O_2/CF_4/HBr=35/30/30$ sccm
First high frequency power: frequency of 100 MHz, power of 600 W, pulse cycle of 10 kHz, duty ratio of 50%
Second high frequency power: frequency of 13.56 MHz, power of 200 W
Processing time: 3 sec
Temperature of the mounting table: 60° C.
(Second Step)
Pressure in the processing chamber: 0.655 Pa (5 mTorr) or less
Processing gas: $O_2/CF_4=35/50$ sccm
First high frequency power: frequency of 100 MHz, power of 600 W, pulse cycle of 10 kHz, duty ratio of 50%
Second high frequency power: frequency of 13.56 MHz, power of 200 W
Processing time: 16 sec
Temperature of the mounting table: 60° C.

Figure 3A:
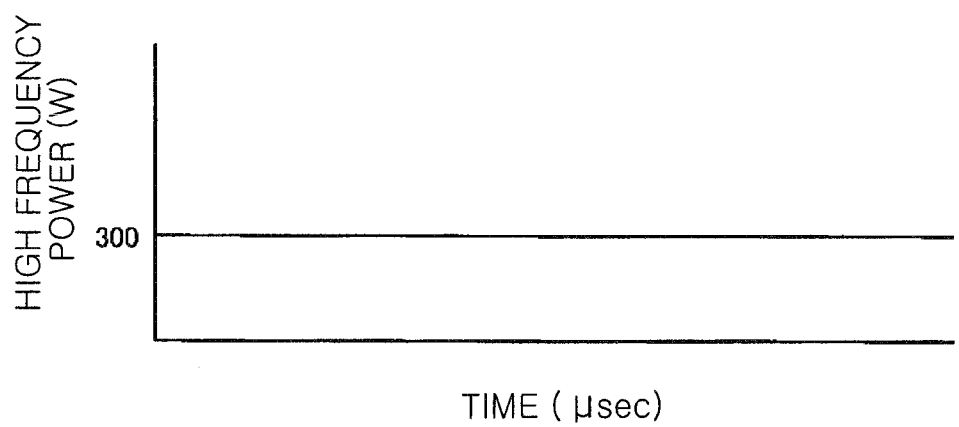
FIGS. 3A and 3B are graphs for explaining application states of high frequency powers.
Figure 3B:
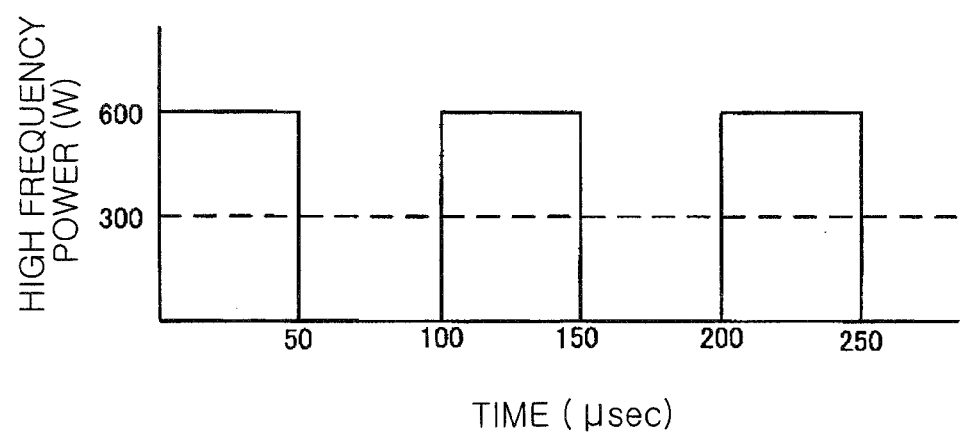

The first high frequency power in the test example is applied at a power level of 600 W, a pulse cycle of 10 kHz and a duty ratio of 50%. In this case, the power is applied in a pulse form shown in the graph of FIG. 3B. In FIG. 3B, the vertical axis represents a high frequency power, and the horizontal axis represents time. An effective power in this case is the same as that of the case of continuously applying a high frequency power at a power level of 300 W which is shown in the graph of FIG. 3A.

Next, in a comparative example 1, as in the case of the test example 1, the plasma etching apparatus 110 shown in FIG. 1 was used to plasma-etch a tungsten layer formed on an Si substrate (semiconductor wafer) having a diameter of 300 mm through a hard mask (formed of a silicon oxide film) patterned thereon in a predetermined shape under the following plasma etching conditions.

COMPARATIVE EXAMPLE 1

Pressure in the processing chamber: 0.655 Pa (5 mTorr) or less
Processing gas: $O_2/CF_4=20/25$ sccm
First high frequency power: frequency of 100 MHz, power of 300 W
Second high frequency power: frequency 13.56 MHz, power of 250 W
Processing time: 70.3 sec
Temperature of the mounting table: 60° C.

Next, in a comparative example 2, plasma etching was performed under the same etching conditions as those of the comparative example 1 except that a first frequency power (frequency of 100 MHz) was applied at a power level of 600 W.

In the comparative examples 1 and 2, a bowing tends to occur in a dense portion of the pattern, and a taper tends to occur in a sparse portion of the pattern. In other words, in the dense portion of the pattern, the sidewalls of the tungsten layers 302 are etched, so that a gap between adjacent patterns is increased, as shown in FIG. 4A.

Figure 4A:
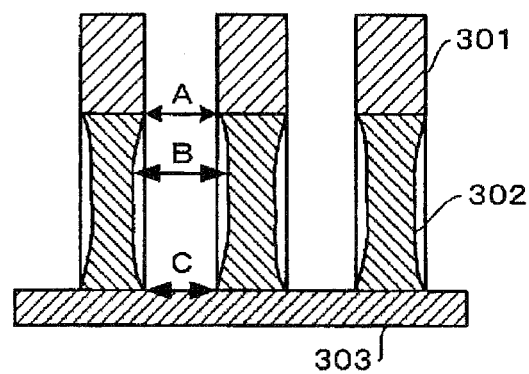
FIGS. 4A and 4B are diagrams for explaining a bowing in a dense portion of a pattern and a taper angle in a sparse portion of the pattern.

In FIG. 4A, a notation A indicates the gap between the adjacent patterns at the bottom portion of the silicon oxide film 301 serving as the hard mask; a notation B indicates a gap (maximum value) between the adjacent patterns in the tungsten layer 302; and a notation C indicates a gap between the adjacent patterns at the bottom portion of the tungsten layer 301. In this case, a value of B-A may be used as a bowing index indicating the degree of bowing.

Figure 4B:
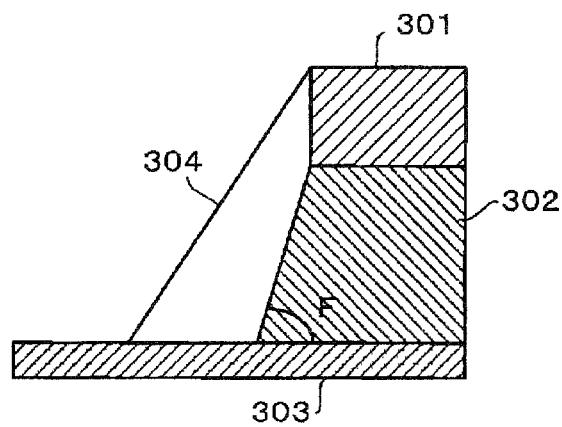

As shown in FIG. 4B, in the sparse portion of the pattern, the sidewall of the tungsten layer 302 is not vertical but inclined in a tapered shape. In this case, the shape can be evaluated by a taper angle F shown in FIG. 4B. As the taper angle F becomes close to 90°, it is considered that the shape is desirable. A reference numeral 304 in FIG. 4B denotes deposits deposited on the sidewall of the tungsten layer 302. In the sparse portion of the pattern, the tungsten layer 302 is etched by a large amount, so that the amount of the deposits 304 is increased. As a result, the sidewall has a tapered shape.

Here, in the case of performing etching under the plasma etching conditions of the comparative examples 1 and 2, the amount of deposits can be increased by increasing a flow rate of oxygen, for example. In this manner, the amount of bowing in the dense portion of the patterns can be decreased. In this case, however, the amount of deposits in the sparse portion of the pattern is also increased. Therefore, the taper angle in the sparse portion is decreased, and the sidewall is inclined from the vertical.

The followings are etching selectivities (etching rate of the tungsten layer 302/etching rate of the silicon oxide film 301), bowing indexes in the dense portion of the pattern, and taper angles in the sparse portion of the pattern which are measured in the test example and the comparative examples 1 and 2.

TEST EXAMPLE

Etching selectivity: 1.6
Bowing index: −0.1 nm
Taper angle: 49°

COMPARATIVE EXAMPLE 1

Etching selectivity: 1.0
Bowing index: 0.3 nm
Taper angle: 34.7°

COMPARATIVE EXAMPLE 2

Etching selectivity: 0.8
Bowing index: 8.8 nm
Taper angle: 38.3°

As described above, in the test example, the plasma etching was performed while ensuring a good etching selectivity, a good bowing index and a good taper angle as compared to the comparative examples 1 and 2. It is considered that the reason why the etching selectivity is improved in the case of applying a high frequency power in a pulse form as in the test example is because the sputtering of the mask by ions is reduced in an off state of the high frequency power and the tungsten layer can be etched by the action of fluorine radicals having a long lifespan even in the off state of the high frequency power. The pulse preferably has a frequency of 1 kHz to 100 kHz, for example. The duty ratio is preferably about 20% to 70%.

In the test example, by continuously and alternately repeating the first step in which deposits are deposited and the second step in which deposits are not deposited, it is possible to suppress generation of bowing in the dense portion of the pattern and suppress decrease of the taper angle in the sparse portion of the pattern. The time for each of the first and the second step is preferably 2 sec or more, and more preferably 3 sec or more, in consideration of gas switching time. In the test example, the ratio of the first and the second step was 3:16. However, it is preferable to set this ratio in consideration of timing at which the first step can be executed again before the deposits deposited in the first step are completely removed in the second step. For example, the ratio of the first and the second step is preferably about 1:3 to 1:8.

The present invention may be variously modified without being limited or the above-described embodiment and test example. For example, in the test example, there has been described the case in which the plasma etching is started with the first step in which deposits are deposited. However, the plasma etching may start with the second step.

INDUSTRIAL APPLICABILITY

The present invention can be used in a semiconductor device manufacturing field or the like and thus has an industrial applicability.

DESCRIPTION OF REFERENCE NUMERALS

111 processing chamber
112 mounting table
115 first high frequency power supply
117 second high frequency power supply
123 shower head
W semiconductor wafer

What is claimed is:

1. A plasma etching method for etching a metal layer of a substrate to be processed through a hard mask by using a plasma etching apparatus which includes a processing chamber configured to accommodate the substrate; a lower electrode, disposed in the processing chamber, for mounting the substrate thereon; an upper electrode disposed opposite to the lower electrode in the processing chamber; an etching gas supply unit configured to supply a predetermined etching gas into the processing chamber; and a gas exhaust unit configured to exhaust the processing chamber, the plasma etching method comprising:
continuously and alternately repeating a plurality of times a first step in which a first etching gas containing a mixed gas of $O_2$, $CF_4$ and HBr is used as the etching gas and a second step in which a second etching gas containing a mixed gas of $O_2$ and $CF_4$ is used as the etching gas while applying a first high frequency power of a first frequency and a second high frequency power of a second frequency lower than the first frequency to the lower electrode, wherein the first high frequency power is applied in a pulse form.

2. The plasma etching method of claim 1, wherein the metal layer is a tungsten layer, and the hard mask is a silicon oxide layer.

3. The plasma etching method of claim 1, wherein the first frequency is higher than or equal to 80 MHz and lower than or equal to 150 MHz.

4. The plasma etching method of claim 1, wherein the first high frequency power is applied in the pulse form at a pulse frequency of 1 kHz to 100 kHz.

5. The plasma etching method of claim 2, wherein the first frequency is higher than or equal to 80 MHz and lower than or equal to 150 MHz.

6. The plasma etching method of claim 2, wherein the first high frequency power is applied in the pulse form at a pulse frequency of 1 kHz to 100 kHz.

7. The plasma etching method of claim 3, wherein the first high frequency power is applied in the pulse form at a pulse frequency of 1 kHz to 100 kHz.

8. The plasma etching method of claim 5, wherein the first high frequency power is applied in the pulse form at a pulse frequency of 1 kHz to 100 kHz.

* * * * *